US011276576B2

(12) United States Patent
Wang et al.

(10) Patent No.: US 11,276,576 B2
(45) Date of Patent: *Mar. 15, 2022

(54) GATE METAL PATTERNING TO AVOID GATE STACK ATTACK DUE TO EXCESSIVE WET ETCHING

(71) Applicant: INTERNATIONAL BUSINESS MACHINES CORPORATION, Armonk, NY (US)

(72) Inventors: Junli Wang, Slingerlands, NY (US); Alexander Reznicek, Troy, NY (US); Shogo Mochizuki, Clifton Park, NY (US); Joshua Rubin, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/681,073

(22) Filed: Nov. 12, 2019

(65) Prior Publication Data
US 2020/0083051 A1 Mar. 12, 2020

Related U.S. Application Data

(63) Continuation of application No. 15/883,503, filed on Jan. 30, 2018, now Pat. No. 10,573,521.

(51) Int. Cl.
H01L 29/786 (2006.01)
H01L 27/092 (2006.01)
(Continued)

(52) U.S. Cl.
CPC .. *H01L 21/28088* (2013.01); *H01L 21/32134* (2013.01); *H01L 27/0886* (2013.01);
(Continued)

(58) Field of Classification Search
CPC ............ H01L 29/78696; H01L 29/511; H01L 29/42392; H01L 29/0673; H01L 27/0886; H01L 21/32134; H01L 21/28088
See application file for complete search history.

(56) References Cited

U.S. PATENT DOCUMENTS 7,402,483 B2 * 7/2008 Yun ................... H01L 29/42392
257/E21.415
7,427,788 B2 9/2008 Li et al.
(Continued)

OTHER PUBLICATIONS

Loubet, N. et al., "Stacked Nanosheet Gate-All-Around Transistor to Enable Scaling Beyond FinFET" 2017 Symposium on VLSI Technology Digest of Technical Papers (Aug. 2017) pp. T230-T231.
(Continued)

Primary Examiner — Earl N Taylor
(74) Attorney, Agent, or Firm — Tutunjian & Bitetto, P.C.; Erik Johnson

(57) ABSTRACT

A method of forming gate structures to a nanosheet device that includes forming at least two stacks of nanosheets, wherein each nanosheet includes a channel region portion having a gate dielectric layer present thereon. The method may further include forming a dual metal layer scheme on the gate dielectric layer of each nanosheet. The dual metal layer scheme including an etch stop layer of a first composition and a work function adjusting layer of a second composition, wherein the etch stop layer has a composition that provides that the work function adjusting layer is removable by a wet etch chemistry that is selective to the etch stop layer.

18 Claims, 9 Drawing Sheets

(51) Int. Cl.
  *H01L 21/28* (2006.01)
  *H01L 27/088* (2006.01)
  *H01L 21/3213* (2006.01)
  *H01L 29/423* (2006.01)
  *H01L 29/51* (2006.01)
  *H01L 29/66* (2006.01)
  *H01L 29/49* (2006.01)
  *H01L 29/775* (2006.01)

(52) U.S. Cl.
  CPC ...... *H01L 27/092* (2013.01); *H01L 29/42392* (2013.01); *H01L 29/4908* (2013.01); *H01L 29/511* (2013.01); *H01L 29/66439* (2013.01); *H01L 29/66545* (2013.01); *H01L 29/66742* (2013.01); *H01L 29/66772* (2013.01); *H01L 29/775* (2013.01); *H01L 29/78696* (2013.01)

(56) References Cited

U.S. PATENT DOCUMENTS

| | | | |
|---|---|---|---|
| 8,658,518 B1 | 2/2014 | Chang et al. | |
| 8,753,942 B2 | 6/2014 | Kuhn et al. | |
| 8,765,546 B1 | 7/2014 | Hung et al. | |
| 8,778,768 B1 | 7/2014 | Chang et al. | |
| 9,287,357 B2 | 3/2016 | Rodder et al. | |
| 9,502,518 B2* | 11/2016 | Liu | H01L 29/0673 |
| 9,570,609 B2* | 2/2017 | Obradovic | H01L 29/78681 |
| 9,653,480 B1* | 5/2017 | Cheng | H01L 21/845 |
| 9,653,537 B1* | 5/2017 | Jagannathan | H01L 29/47 |
| 9,685,522 B1* | 6/2017 | Kim | H01L 21/28088 |
| 9,842,914 B1* | 12/2017 | Yeung | H01L 29/66553 |
| 9,847,390 B1* | 12/2017 | Xie | H01L 21/76897 |
| 9,935,014 B1* | 4/2018 | Cheng | H01L 21/823412 |
| 9,972,542 B1* | 5/2018 | Bi | H01L 21/02532 |
| 9,997,519 B1* | 6/2018 | Bao | H01L 29/4966 |
| 10,002,939 B1* | 6/2018 | Cheng | H01L 29/511 |
| 10,074,575 B1* | 9/2018 | Guillorn | H01L 29/66545 |
| 10,103,065 B1* | 10/2018 | Mochizuki | H01L 29/401 |
| 10,573,521 B2* | 2/2020 | Wang | H01L 29/66742 |
| 2007/0052037 A1 | 3/2007 | Luan | |
| 2015/0364542 A1* | 12/2015 | Rodder | B82Y 40/00 257/29 |
| 2015/0364546 A1* | 12/2015 | Rodder | H01L 29/42392 257/9 |
| 2017/0040209 A1* | 2/2017 | Wang | H01L 21/31105 |
| 2017/0110554 A1* | 4/2017 | Tak | H01L 29/42392 |
| 2017/0117359 A1* | 4/2017 | Cheng | H01L 29/0673 |
| 2017/0125408 A1* | 5/2017 | Park | H01L 29/7851 |
| 2017/0207313 A1* | 7/2017 | Song | H01L 29/775 |
| 2017/0221893 A1* | 8/2017 | Tak | H01L 29/0665 |
| 2017/0250261 A1* | 8/2017 | Kim | H01L 29/66742 |
| 2017/0250291 A1* | 8/2017 | Lee | H01L 29/0665 |
| 2017/0358665 A1* | 12/2017 | Song | H01L 29/495 |
| 2017/0365604 A1* | 12/2017 | Suh | H01L 29/165 |
| 2018/0053690 A1* | 2/2018 | Wang | H01L 21/02603 |
| 2018/0114834 A1* | 4/2018 | Cheng | H01L 29/0665 |
| 2018/0122899 A1* | 5/2018 | Guillorn | H01L 29/78654 |
| 2018/0148645 A1* | 5/2018 | Lee | H01L 21/32134 |
| 2018/0182856 A1* | 6/2018 | Lee | H01L 21/76849 |
| 2018/0226484 A1* | 8/2018 | Bao | B82Y 10/00 |
| 2018/0261460 A1* | 9/2018 | Hwang | H01L 27/0924 |
| 2018/0294331 A1* | 10/2018 | Cho | H01L 29/0607 |
| 2018/0301383 A1* | 10/2018 | Kim | H01L 27/092 |
| 2018/0342427 A1* | 11/2018 | Xie | H01L 29/785 |
| 2019/0035888 A1* | 1/2019 | Wu | H01L 29/0653 |
| 2019/0237336 A1* | 8/2019 | Wang | H01L 29/42392 |
| 2020/0083051 A1* | 3/2020 | Wang | B82Y 10/00 |

OTHER PUBLICATIONS

Sahay, S. et al., "A Novel Gate-Stack-Engineered Nanowire FET for Scaling to the Sub-10-nm Regime" IEEE Transactions on Electron Devices (Dec. 2016) pp. 5055-5059, vol. 63, issue 12.

List of IBM Patents or Patent Applications Treated as Related dated Nov. 12, 2019, 2 pages.

* cited by examiner

GATE METAL PATTERNING TO AVOID GATE STACK ATTACK DUE TO EXCESSIVE WET ETCHING

BACKGROUND

Technical Field

The present disclosure relates to semiconductor devices, and more particularly to semiconductor devices including channel regions integrated within nanosheets.

Description of the Related Art

With the continuing trend towards miniaturization of integrated circuits (ICs), there is a need for transistors to have higher drive currents with increasingly smaller dimensions. The use of non-planar semiconductor devices such as, for example, nanowire and nano-sheet transistors may be the next step in the evolution of complementary metal oxide semiconductor (CMOS) devices.

SUMMARY

In one embodiment, the present disclosure provides a suspended channel field effect transistor (FET), i.e., nanosheet. The method may include forming at least two stacks of nanosheets, wherein each nanosheet in each of said at least two stacks of nanosheets includes a gate dielectric layer present on a channel region portion of each nanosheet. The method may further include forming a dual metal layer scheme on the gate dielectric layer of each nano sheet, the dual metal layer scheme comprising an etch stop layer of a first composition and a work function adjusting layer of a second composition, wherein the etch stop layer has a composition that provides that the work function adjusting layer is removable by a wet etch chemistry that is selective to the etch stop layer.

In another embodiment of the present disclosure, a method is provided for producing nanosheet semiconductor devices having different conductivity types on a same semiconductor substrate, e.g., in a complementary metal oxide semiconductor (CMOS) arrangement. In one embodiment, the method includes forming a first stack of suspended nanosheets on a first region of a substrate, and forming a second stack of suspended nanosheets on a second region of the substrate. A gate dielectric is then formed on a channel region of each nanosheet of the first stack of suspended nanosheets and the second stack of suspended nanosheets. A dual metal layer scheme is formed on the gate dielectric layer of each nanosheet, the dual metal layer scheme comprising an etch stop layer of a first composition and a work function adjusting layer of a second composition, wherein the etch stop layer has a composition that provides that the work function adjusting layer is removable by a wet etch chemistry that is selective to the etch stop layer. The method may continue with removing the work function adjusting layer from the second stack of suspended nanosheets in the second region of the substrate, while the work function adjusting layer remains on the first stack of suspended nanosheets. The work function adjusting layer is removed from the second stack of suspended nanosheets by a wet chemical etch that is selective to the etch stop layer. The etch stop layer allows for an entirety of the work function adjusting layer to be removed from the second stack of the suspended nanosheets by protecting the underlying gate dielectric on at least the edges and upper sheet surface of the channel region of the nanosheets. In a following process step, a gate conductor is formed to each of the first and second stacks of suspended nanosheets providing a functional gate structure for a first conductivity type device including the first stack of suspended nanosheets and a second conductivity type device including the second stack of suspended nanosheets.

In another aspect, an electrical device is provided including two different conductivity type, i.e., n-type or p-type conductivity, semiconductor devices including suspended nanosheet channel regions that are both present on the same supporting substrate. In one embodiment, the electrical device includes a first stack of suspended nanosheets in a first region of a substrate containing first conductivity type nanosheet devices; and a second stack of suspended nanosheets in a second region of the substrate including second conductivity type nanosheet devices. The channel region for each of the first and second stack of suspended nanosheets includes a high-k gate dielectric having a substantially conformal thickness around an entirety of each nanosheet in the first and second stack of suspended nanosheets, and having edges that are free of etch damages or etch residue. An etch stop layer of a first metal nitride is present on the gate dielectric for each of said nanosheet of said first stack of suspended nanosheets. At least one of the first and second stacks of suspended nanosheets includes a work function adjusting metal containing layer, wherein the work function adjusting metal containing layer in the first stack is present on the etch stop layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION

Figure 2:
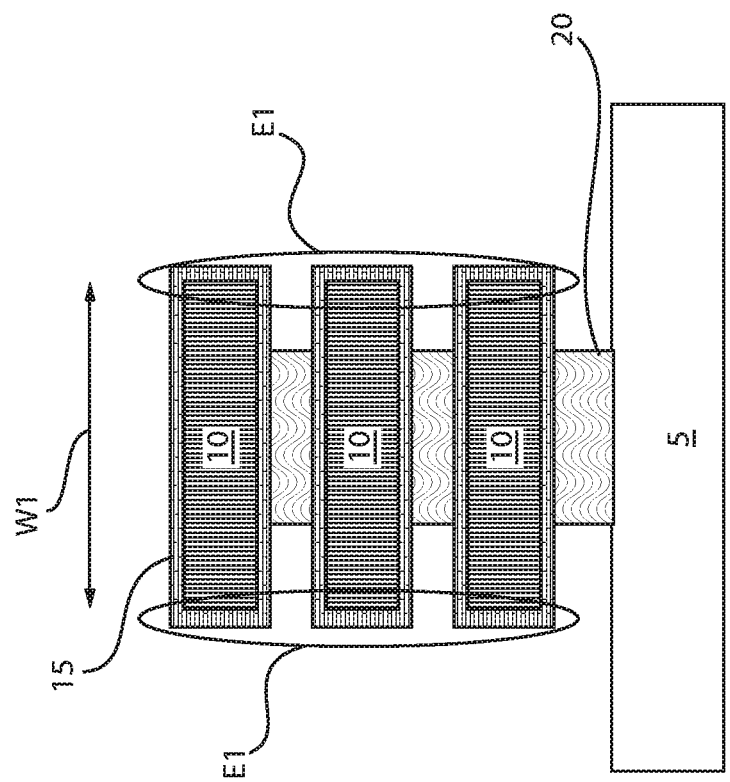
FIG. 2 is a side cross-sectional view depicting a pinch off region between adjacently stacked nanosheets having a remaining portion of the gate metal present therein following the application of a wet etchant applied to the structure depicted in FIG. 1 to remove the gate metal, wherein over etching of the gate metal damages the underlying gate dielectric and channel semiconductor material at the exposed edges of the nanosheets.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one aspect, embodiments of the present disclosure describe a nano-sheet transistors. Nanosheet MOSFET is a candidate for future complementary metal oxide semiconductor (CMOS) technology. For example, nanosheet is being pursued as a viable device option beyond 7 nm. Integration is very tight in 7 nm and scaling beyond those dimensions. For example, in a complementary metal oxide semiconductor (CMOS) arrangement including both n-type and p-type nanosheet devices being processed on a same substrate, during gate metal patterning and metal removal from a first conductivity type, e.g., n-type or p-type conductivity type, nanosheet structure, while attempting to protect the gate metal on a second conductivity type, e.g., n-type or p-type, nanosheet structure that is different from the first conductivity type, it has been determined that the wet etchants that are intended to remove the exposed metals leak under block masks and attack the metals that are intended to remain in the device structure.

The above example of uncontrolled excessive etching in nanosheet devices during complementary metal oxide semiconductor (CMOS) type process flows can be overcome by the methods and structures described herein, which include a protected dual layer scheme within the channel regions of the nanosheet device structures. As will be described in further details below, the protective dual liner may include two metal nitride compositions that are selected so that during etching of the exterior or second layer, and underlying gate dielectric is provided by the first layer, in which the composition of the second layer provides that is be removed selectively to the second layer. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1.

In one example, the first metal layer of the dual layer scheme metal patterning is composed of tantalum nitride (TaN) and the second metal layer is composed of titanium nitride (TiN), or TiAl, or TiAlC. During etch processes applied to two channel regions of nanosheet devices having different conductivity types, the wet etch for removing the second metal layer, i.e., TiN layer or TiAl, or TiAlC, is selective to the first metal layer, i.e., TaN layer; and during the second metal layer etch, the high-k gate dielectric that is underlying the first metal layer, e.g., TaN layer, is protected by the first metal layer. During the first metal layer etch, the tunnel between the nanosheets is not pinched off, in which much more of the over etch to the high-k gate dielectric can be avoided. Further details regarding the method and structures of the present disclosure are now described with reference to FIGS. 1-4.

Figure 1:
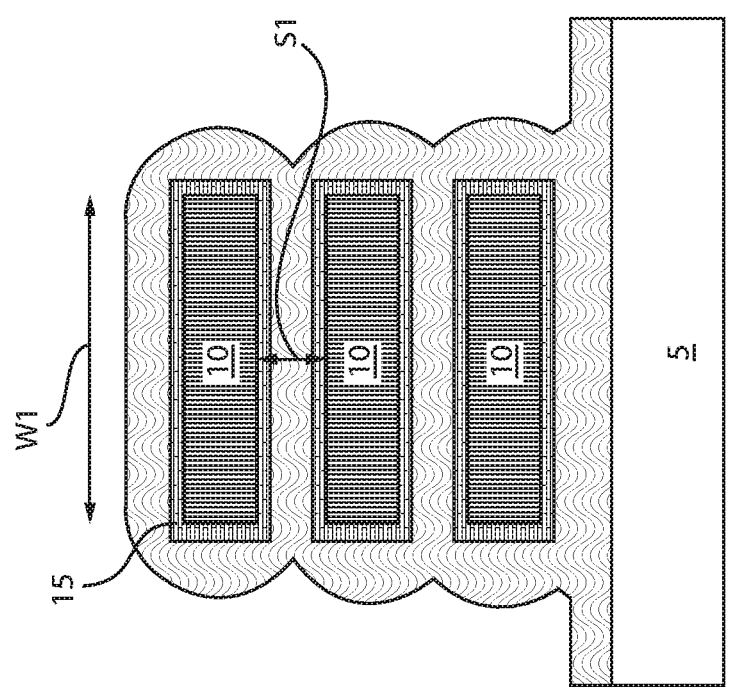
FIG. 1 is a side cross-sectional view depicting the channel region of a stack of nanosheets having a gate metal present thereon, wherein the nanosheets are suspended over a supporting substrate.

FIGS. 1 and 2 illustrate one example of over-etching in the channel region of the nanosheet devices that has been discovered in connection with forming multiple nanosheet devices using a replacement gate process, and in some cases different types of material layers for the functional gate structures to the different FinFET devices on the semiconductor substrate. For example, over etching has been observed in CMOS processing of nanosheet devices during gate metal removal from the p-type conductivity device, e.g., pFET type device, while keeping the gate metal on the n-type conductivity device, e.g., on the nFET type device; or vice versa. Metal removal from the channel regions of the devices is performed using wet etching. For removing gate material layers, e.g., metal layers for the gate structure, from a replacement gate structure to a field effect transistor having a channel region provided by a nanosheet architecture, the wet etchant is applied for a long time that is not typical of wet etch processes used in planar or FinFET device geometries. For example, the long duration of the wet etch process can be used to remove any pinched off metal that is present between, i.e., inside, stacked nanosheets 10 of the channel region of the device. This is depicted by the comparison of FIG. 1 and FIG. 2. FIG. 1 is a side cross sectional view of the channel region of a stack of nanosheets 10 having a gate metal 20 present thereon, wherein the nanosheets 10 are suspended over a supporting substrate 5. For example, the width W1 for each of the nanosheets 10 may range from 5 nm to 100 nm, and the distance separating adjacently stacked nanosheets 10 may be 5 nm to 20 nm. FIG. 1 also depicts how the gate metal 20 is present surrounding each of the adjacently stacked nanosheets 10, wherein a conformal gate dielectric 15 is also present around the entire perimeter of the nanosheets 10. The structure depicted in FIG. 1 illustrates how the channel region of a nanosheet device may look prior to removing the gate metal 20 in a replacement gate process. In some instances, at least a second stack of nanosheets (not shown) is present on the same supporting substrate 5 as the stack of nanosheets 10 that are depicted in FIG. 1. As will be described in further detail below, the replacement gate processes that are described herein, which employ wet chemical etch processes to remove metal gate material layers, may be used to independently process one region of the substrate 5 containing nanosheet devices of a first conductivity type, i.e., p-type, from another region of the substrate 5 containing nanosheet devices of a second conductivity type, i.e., n-type.

FIG. 2 illustrates how the width W1 of the nanosheets 10, as well as the space separating the adjacently stacked nanosheets 10, results in a pinch off region of remaining metal from the gate metal that is present between adjacently stacked nanosheets 10 following etch chemical etching to remove the gate metal 20. FIG. 2 depicts a pinch off region between adjacently stacked nanosheets 10 having a remaining portion of the gate metal 20 present therein following the application of a wet etchant to remove the gate metal. In this example, over-etching of the gate metal 20 damages the underlying gate dielectric 15 and channel semiconductor material at the exposed edges E1 of the nanosheets 10.

FIG. 2 illustrates that during the middle of the etch process duration for removing the gate metal 20, the gate dielectric 15 at the top sheet surface of the uppermost nanosheet 10, and corners of all of the nanosheets, i.e., at both sides of the gate structure, can be exposed by the wet etch process. These corners of the nanosheets 10 are identified by reference number E1 in FIG. 2. As the wet etch process duration increases, the material layers on the top sheet surface of the uppermost nanosheet 10, and the edges E1 of the nanosheets 10, can be aggressively etched as the structure is over etched in attempts to remove the gate metal 20 from the pinch off region. The degree of over etching can be significantly greater in nanosheet devices than the amount of over-etching that can occur in conventional geometry, i.e., planar, metal oxide semiconductor field effect transistors (MOSFETs) and/or fin type field effect transistors (FinFETs). Therefore, the gate dielectric 15, e.g., high-k gate dielectric, that is present on the edges E1 and the top sheet surface of the uppermost nanosheet 10 is more aggressively attacked by over etching in nanosheet devices, as depicted in FIGS. 1 and 2, than conventional geometry field effect transistor semiconductor devices, e.g., planar, metal oxide semiconductor field effect transistors (MOSFETs) and/or fin type field effect transistors (FinFETs).

Figure 4:
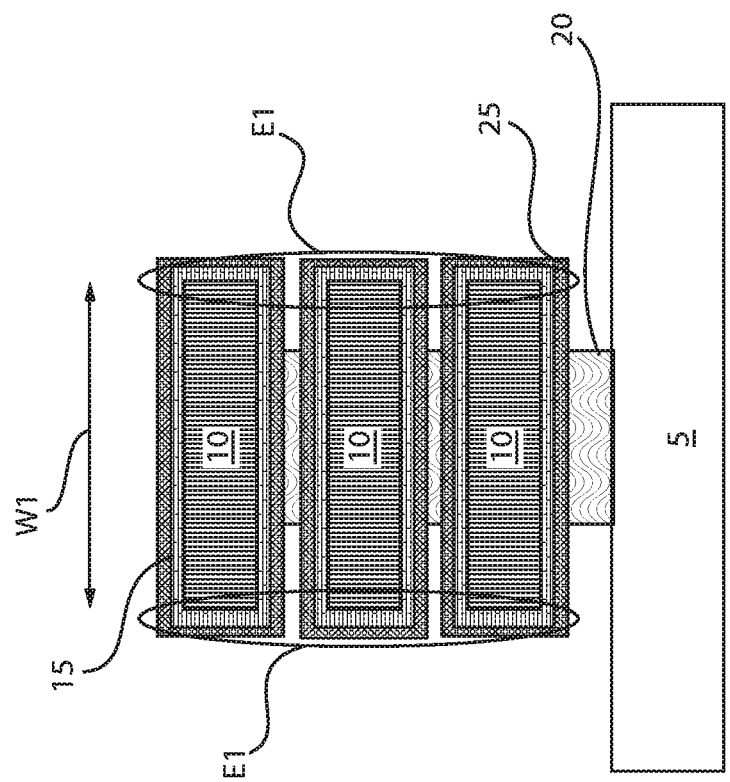
FIG. 4 is a side cross-sectional view depicting a pinch off region between adjacently stacked nanosheets having a remaining portion of the gate metal present therein following the application of a wet etchant applied to the structure depicted in FIG. 3 to remove the gate metal, wherein the etch stop layer reduces over etching effects.
Figure 3:
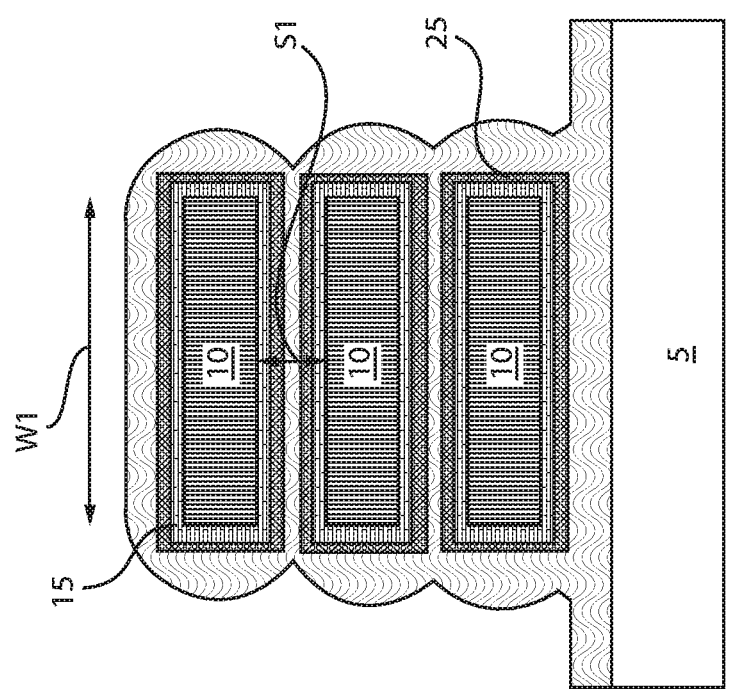
FIG. 3 is a side cross-sectional view depicting one embodiment of a dual layer scheme applied to the channel region of a stack of nanosheets, in which the dual layer scheme includes a gate metal and an etch stop layer.

Referring to FIGS. 3 and 4, to address the above over etching scenario that has been described above with reference to FIGS. 1 and 2, a dual layer scheme is described herein for protecting the channel region of the nanosheets, i.e., the semiconductor material of the nanosheet 10 and/or the gate dielectric 15 that is present on the semiconductor material of the nanosheet 10. For example, in one embodiment, the dual layer scheme may be configured for the channel region of a p-type nanosheet device, in which a first layer, i.e., etch stop layer 25, is composed of a first nitride, and is present directly on gate dielectric 15 that is present on the channel region of the nanosheets 10, and a second layer, i.e. gate metal layer 20, that is present on the first layer. In some embodiments, when the gate metal layer 20 is composed of titanium nitride (TiN), or TiC, or TiAlC, the etch stop layer 25 is composed of tantalum nitride (TaN).

FIG. 3 depicts one embodiment of the dual layer scheme applied to the channel region of a stack of nanosheets 10. The nanosheets 10 that are depicted in FIG. 3 may have dimensions for their width W1 and degree of separation S1, as described above with reference to FIGS. 1 and 2. For example, the width W1 may range from 5 nm to 100 nm, and the separation S1 may be 5 nm to 20 nm. The nanosheets 10 may be composed of a type IV semiconductor, such as silicon (Si), germanium (Ge), silicon germanium (SiGe) or a combination thereof. In other embodiments, the nanosheets 10 may be composed of a type III-V semiconductor material, such as gallium arsenide (GaAs), indium gallium arsenide (InGaAs) or a combination thereof. The gate dielectric 15 that is present on the channel region of the nanosheets 10 may be composed of a high-k gate dielectric. High-k gate dielectrics have a dielectric constant that is greater than the dielectric constant of silicon oxide ($SiO_2$) at room temperature (e.g., 20° C. to 25° C.) and atmospheric pressure, i.e., 1 atm. An example of a high-k dielectric material that can be used for the gate dielectric 15 is hafnium oxide ($HfO_2$).

The structure depicted in FIG. 3 illustrates how the channel region of a nanosheet device may look prior to removing the gate metal 20 in a replacement gate process, in which the etch stop layer 25 protects the edge portions E1 of the nanosheets 10, as well as the upper sheet surface of the nanosheets 10 from the wet etch chemistry that removes the gate metal 20. In some instances, at least a second stack of nanosheets (not shown) is present on the same supporting substrate 5 as the stack of nanosheets 10 that are depicted in FIG. 1. As will be described in further detail below, the replacement gate processes that are described herein, which employ wet chemical etch processes to remove metal gate material layers, may be used to independently process one region of the substrate 5 containing nanosheet devices of a first conductivity type, i.e., p-type, from another region of the substrate 5 containing nanosheet devices of a second conductivity type, i.e., n-type. As will be described below, this can allow for different metal composition material layers to provide different work functions that can be suitable for both n-type and p-type devices on the same semiconductor substrate 5.

In some embodiments, the dual layer scheme includes an etch stop layer 25. The composition of the etch stop layer 25 is selected so that the wet etch chemistry that removes the gate metal 20 does not remove the etch stop layer 25. More specifically, the composition of the etch stop layer 25 is selected so that the gate metal 20 is removed selectively to the etch stop layer 25. For example, the composition of the etch stop layer 25 may be a first metal nitride, and the gate metal 20 may be composed of a second metal nitride, in which the second metal nitride can be removed by a wet etch chemistry that is selective to the first metal nitride. For example, the first metal nitride may be tantalum nitride (TaN), while the second metal nitride may be composed of titanium nitride (TiN), or TiAl, or TiAlC. The etch stop layer 25 may be a conformal layer that is present on an entirety of the channel region portion of the nanosheets 10. The term "conformal" denotes a layer having a thickness that does not deviate from greater than or less than 30% of an average value for the thickness of the layer. For example, the etch stop layer 25 may have a thickness ranging from 1 nm to 10 nm. In other examples, the etch stop layer 25 can have a thickness ranging from 2 nm to 5 nm. The etch stop layer 25 can be formed using any conformal deposition process, such as atomic layer deposition (ALD). In other examples, the etch stop layer 25 may be deposited using plasma enhanced chemical vapor deposition (PECVD) and/or metal organic chemical vapor deposition (MOCVD).

As noted above, the composition of the gate metal 20 can be removed by an etch chemistry that is selective to the etch stop layer 25. In some embodiments, the composition of the gate metal 20 is also selected to provide a work function adjustment for the gate structure of the nanosheet device, in which the gate metal 20 remains, i.e., is not removed by the wet chemical etch. As noted above, although FIG. 3 only depicts a single gate structure, the methods and structures described herein are applicable to processing multiple conductivity type nanosheets on the same substrate 5, e.g., in a complementary metal oxide semiconductor (CMOS) type arrangement. For processing multiple conductivity semiconductor devices, the composition for the gate metal 20 may be selected for one region of devices, but blanket deposited into both regions of the substrate. Thereafter, the region of the device in which the gate metal 20 remains is masked with an etch mask; and the gate metal 20 is removed from the regions of the device in which the work function adjustment for the gate metal 20 does not advantageously impact the devices within that region. As noted above, the gate metal 20 may be removed using a wet chemical etch that is selective to the etch stop layer 25, wherein the etch stop layer 25 protects the underlying gate dielectric 15 and the nanosheet 10. In the embodiment depicted in FIGS. 3 and 4, the gate metal 20 is being removed from a nanosheet stack 10 that is being employed for providing a p-type device. Although not depicted in FIGS. 3 and 4, the gate metal 20 material layer remains on nanosheet stacks that are used for providing an n-type device. Therefore, in the embodiments that are depicted in FIGS. 3 and 4, the metal gate 20 can be composed of a composition that provides an n-type work function shift. In some embodiments, to provide the n-type work function shift for the n-type nanosheet semiconductor device, the metal gate 20 may be composed of metal nitride (TiN) or TiAl, or TiAlC.

The gate metal 20 may be deposited to a thickness that fills the space between adjacent nanosheets 10, as well as encapsulating the nanosheets 10 with gate material. In some embodiments, the gate metal 20 may be deposited at a thickness greater than the thickness of the gate dielectric 15. For example, the gate metal 20 may be deposited to a thickness ranging from 5 nm to 50 nm. The gate metal 20 may be deposited using physical vapor deposition (PVD), such as sputtering; chemical vapor deposition (CVD), such as plasma enhanced chemical vapor deposition (PECVD); plating, such as electroless plating and/or electroplating; atomic layer deposition (ALD); and combinations thereof.

FIG. 4 depicts applying a wet chemical etch to the structure depicted in FIG. 3 to remove the gate metal 20. In some embodiments, the gate metal 20 is removed by a wet chemical etch that is selective to the etch stop layer 25 of the dual layer gate structure scheme, wherein the etch stop layer 25 protects the underlying gate dielectric 15 and the semiconductor material of the nanosheets 10 from the damages of over etching effects. Referring to FIG. 4, a pinch off region of remaining gate metal 20 is depicted between adjacently stacked nanosheets 10. The structure depicted in FIG. 4 illustrates a remaining portion of the gate metal 20, i.e., pinch off portion, that is present between adjacently stacked nanostructures 10 following the application of a wet etchant applied to the structure depicted in FIG. 3 to remove the gate metal 20. Like the structures described with reference to FIGS. 1 and 2, at this stage of the etch process, a majority of the gate metal 20 is removed including portions from the upper surface layer of the uppermost nanosheet 10 and portions from the edges E1 of the nanosheets 10. Different from the structures described with reference to FIGS. 1 and 2, the etch stop layer 25 protects the underlying gate dielectric 15 and the underlying portions of the nanosheets 10 from being etched, i.e., over etched, by the wet chemical etchant that is removing the gate metal 10.

A more complete replacement gate process flow for forming nanosheets including the dual layer scheme is now described with detail to FIGS. 5-11.

Figure 5:
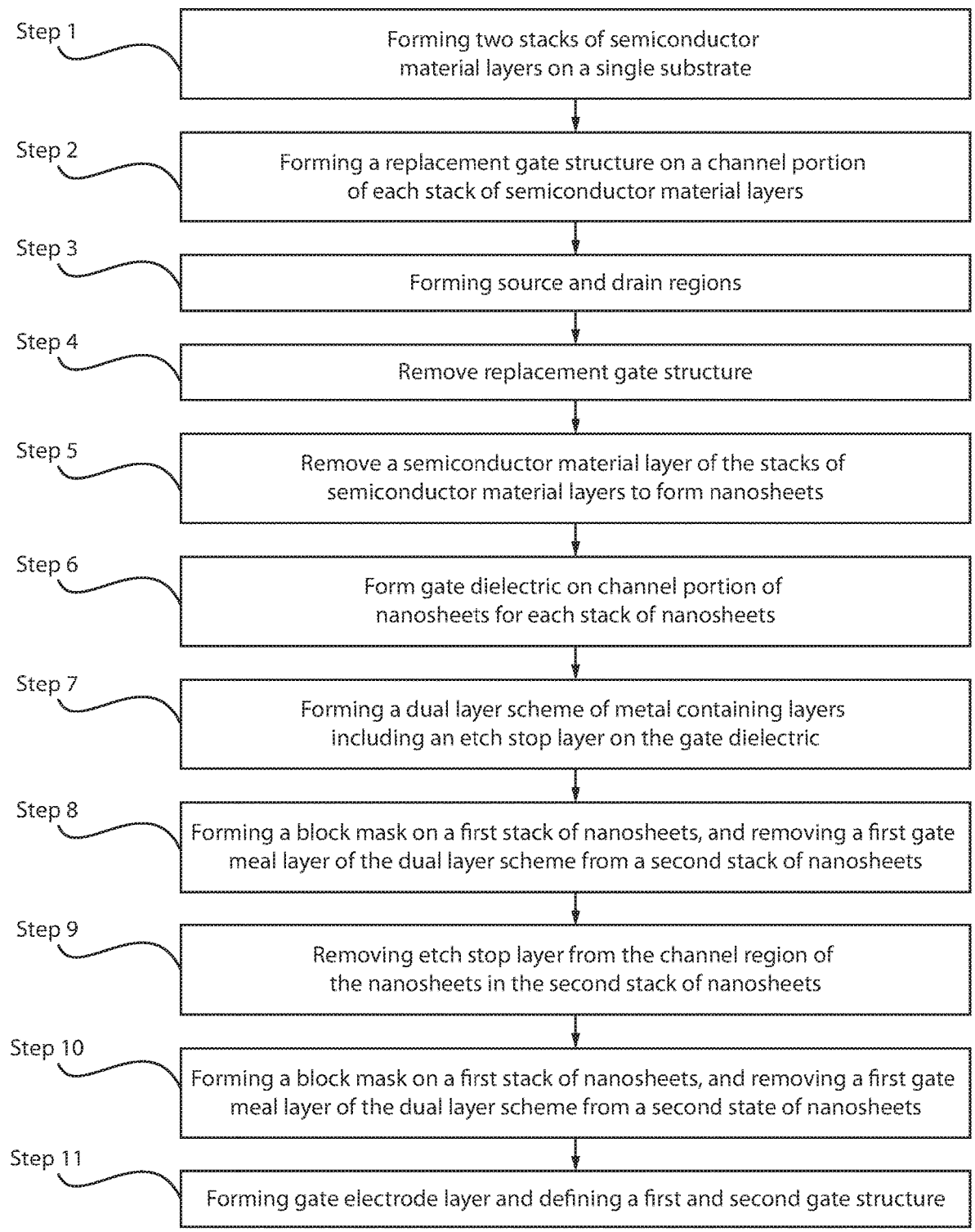
FIG. 5 is a flow chart describing one embodiment of a method for forming gate structures to nanosheet semiconductor devices.

FIG. 5 is a flow chart describing a process flow that employs the dual layer scheme for independently processing the gate structures of one conductivity type set of nanosheet semiconductor devices relative to the gate structures of a second conductivity type set of nanosheet semiconductor devices.

Figure 6:
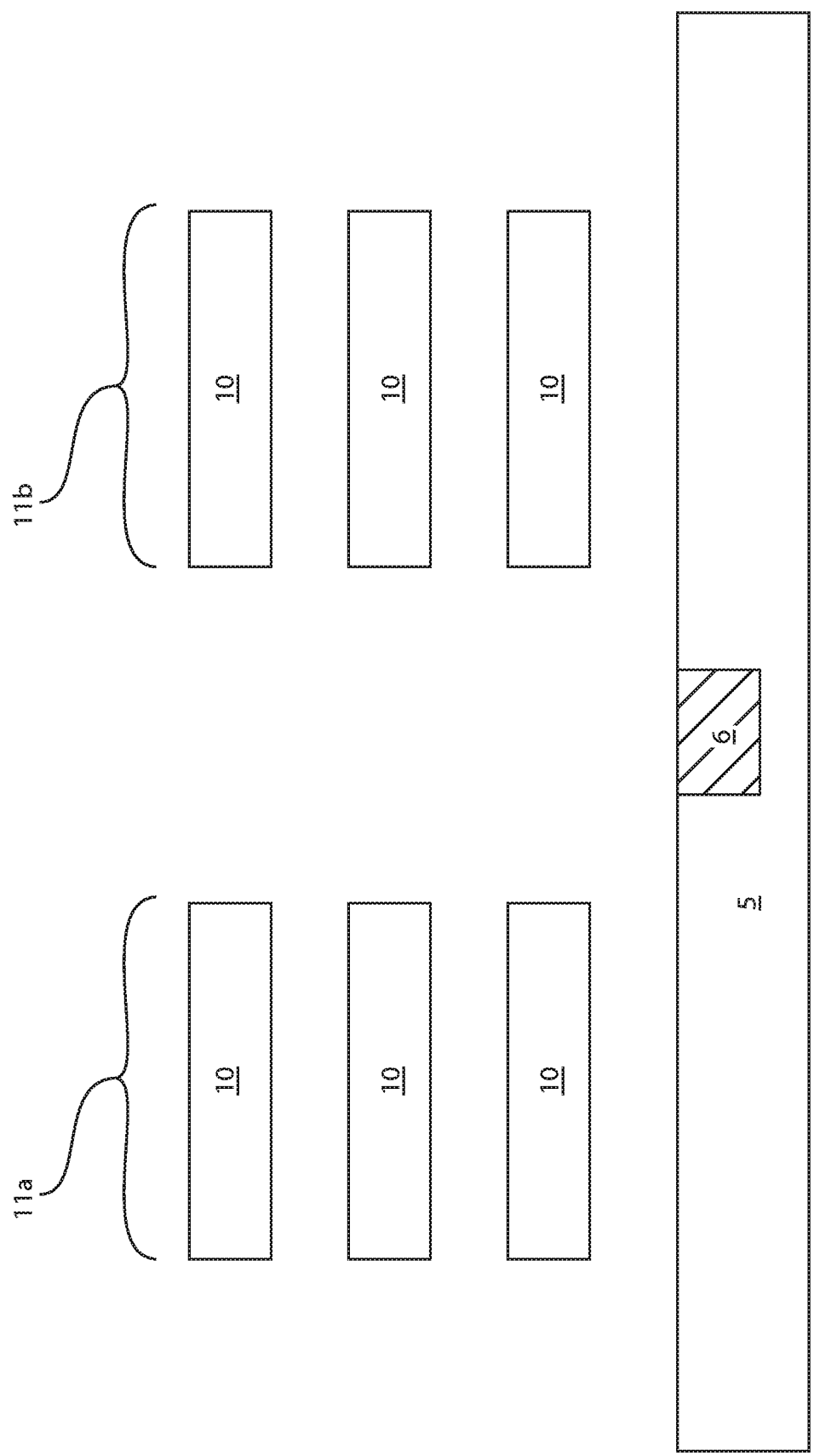
FIG. 6 is a side cross-sectional view depicting the channel region of two stacks of nanosheets.

Step 1 of the process flow in the flow chart depicted in FIG. 5 includes forming at least two sets of nano-sheet stacks (a nanosheet is identified by reference number 10 in FIG. 3) on a single substrate 5, as depicted in FIG. 6.

The substrate 5 may be composed of a supporting material, such as a semiconductor material, e.g., silicon, or dielectric material, such as silicon oxide or silicon nitride.

The stacks 11a, 11b of nanosheets 10 are formed from stacks of layered semiconductor materials. The stacks of the at least two semiconductor materials are typically composed of two alternating materials. For example, the first semiconductor material that is present on the substrate 5 for each of the stacks 11a, 11b may be composed of a silicon and germanium containing semiconductor material, such as silicon germanium (SiGe), whereas the second semiconductor material for the stacks 11a, 11b that is present on the first semiconductor material may be composed of a germanium free silicon containing semiconductor material, such as silicon (Si). It is noted that this is only one example of semiconductor materials that may be used for the stacks 11a, 11b of nanosheets 10. Any semiconductor material composition may be used for each of the at least two semiconductor materials 5a, 5b so long as at least one of the compositions selected allow for selective etching between at least two of them. Any type IV semiconductor composition combination and/or III-V semiconductor composition combination is suitable for use with the present disclosure. For example, the compositions selected for the at least two semiconductor materials include Si, SiGe, SiGeC, SiC, single crystal Si, polysilicon, i.e., polySi, epitaxial silicon, i.e., epi-Si, amorphous Si, i.e., α:Si, germanium, gallium arsenide, gallium nitride, cadmium telluride and zinc sellenide.

The stacks 11a, 11b of the at least two semiconductor materials may be formed using a deposition process, such as chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes suitable for use the present disclosure include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

The thickness of each of the at least two semiconductor material layers may range from 1 nm to 30 nm. In another embodiment, the thickness of each of the at least two semiconductor material layers may range from 5 nm to 20 nm.

Following deposition, the semiconductor material layers may be patterned to provide the geometry of the stacks 11a, 11b of the nanosheets 10. In some embodiments, the semiconductor material layers may be patterned using deposition, photolithography and subtractive etch processing.

A shallow trench isolation region 6 may be formed between the stack of semiconductor material layers that provides the stack 11a of nano sheets 10 for the first conductivity device, and the stack of semiconductor material layers that provides the stack 11b of the nanosheets 10 for the second conductivity device.

Referring to FIG. 5, the process flow may continue with forming a replacement gate structures on the channel portions of the stack of the at least two semiconductor materials. By "replacement" it is meant that the structure is present during processing of the semiconductor device, but is removed from the semiconductor device prior to the device being completed. In the present process flow, a replacement gate structure 15 is employed as part of a replacement gate process. As used herein, the term "replacement gate structure" denotes a sacrificial structure that dictates the geometry and location of the later formed functioning gate structure. The "functional gate structure" operates to switch the semiconductor device from an "on" to "off" state, and vice versa.

In one embodiment, the sacrificial material that provides the replacement gate structure may be composed of any material that can be etched selectively to the at least one of the material layers of the stacks of the at least two semiconductor materials. In one embodiment, the replacement gate structure may be composed of a silicon-including material, such as polysilicon. In another embodiment, the replacement gate structure may be composed of a dielectric material, such as an oxide, nitride or oxynitride material, or amorphous carbon. The replacement gate structure may be formed using deposition (e.g., chemical vapor deposition) photolithography and etch processes (e.g., reactive ion etching).

A spacer is formed on the sidewall of each of the replacement gate structures for the first conductivity type nanosheet devices and the second conductivity type nanosheet devices. The spacer is typically composed of a dielectric material, such as an oxide, nitride, or oxynitride material. The spacer may be formed using a deposition process, such as chemical vapor deposition (CVD), and an anisotropic etch back method.

Following the formation of the replacement gate structure, the exposed portions of the stack of two semiconductor materials that extend beyond the replacement gate structures for each of the stack of nanosheets 11a for the first conductivity type nanosheet device and the stack of nanosheets 11b for the second conductivity type nanosheet device. In some embodiments, the etch process for removing the exposed portions of the stacks of the at least two semiconductor materials is an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

Referring to FIG. 5, in one embodiment, the method continues with forming the source and drain regions for the first conductivity type nanosheet devices and the second conductivity type nanosheet devices at step 3. The term "conductivity type" denotes whether a device has source and drain regions doped to an n-type or a p-type conductivity type. As used herein, "p-type" refers to the addition of impurities to an intrinsic semiconductor that creates deficiencies of valence electrons. For example, in a type IV semiconductor material, such as silicon (Si), germanium (Ge) or silicon germanium (SiGe), examples of p-type dopants, i.e., impurities, include but are not limited to: boron, aluminum, gallium and indium. As used herein, "n-type" refers to the addition of impurities that contributes free electrons to an intrinsic semiconductor. For example, in a type IV semiconductor, such as a silicon (Si), germanium (Ge), and silicon germanium (SiGe), examples of n-type dopants, i.e., impurities, include but are not limited to antimony, arsenic and phosphorous.

The source and drain regions may be composed of epitaxial semiconductor material. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

The epitaxial semiconductor material grows from the etched sidewall surface of the semiconductor material layers that provide the stacks 11a, 11b of nanosheets 10. In some embodiments, the epitaxial semiconductor material may be composed of silicon (Si), germanium (Ge), silicon germanium (SiGe), silicon doped with carbon (Si:C) or the epitaxial semiconductor material 35 may be composed of a type III-V compound semiconductor, such as gallium arsenide (GaAs). In one embodiment, a number of different sources may be used for the epitaxial deposition of the epitaxial semiconductor material. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming an undoped epitaxial semiconductor material of a germanium containing semiconductor include germane, digermane, halogermane, dichlorogermane, trichlorogermane, tetrachlorogermane and combinations thereof.

Epitaxial deposition may be carried out in a chemical vapor deposition apparatus, such as a metal organic chemical vapor deposition (MOCVD) apparatus or a plasma enhanced chemical vapor deposition (PECVD) apparatus. The epitaxial semiconductor material may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In the embodiments in which the semiconductor device being formed has p-type source and drain regions, and is referred to as a p-type semiconductor device, the doped epitaxial semiconductor material 35 is doped with a p-type dopant to have a p-type conductivity. In a type IV semiconductor, such as silicon, examples of p-type dopants, i.e., impurities, include but are not limited to, boron, aluminum, gallium and indium. In a type IV semiconductor, such as silicon, examples of n-type dopants, i.e., impurities, include but are not limited to antimony, arsenic and phosphorous.

In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). The p-type gas dopant source may include diborane ($B_2H_6$).

Referring to FIG. 6, in some embodiments, the source and drain regions to the first stack 11a of nanosheets 10 may be doped to a p-type conductivity to provide p-type nanosheet semiconductor devices; and the source and drain regions to the first stack 11b of nanosheets may be doped to an n-type conductivity to provide n-type nanosheet semiconductor devices.

Referring to FIG. 5, the method may continue with removing the replacement gate structures at step 4. In some embodiments, removing the replacement gate structure may begin with forming an interlevel dielectric layer on the portions of the device including the source and drain regions, and planarizing the interlevel dielectric layer to expose an upper surface of the replacement gate structures to each stack of semiconductor material layers that provides the stack of nanostructures 11a for the first conductivity type device, and the stack of nanostructures 11b for the second conductivity type device. The replacement gate structure may be removed using a wet or dry etch process. In one embodiment, the first replacement gate structure may be removed by at least one of an anisotropic etch process, such as reactive ion etch (RIE), or an isotropic etch process, such as a wet chemical etch. In one example, the etch process for removing the first replacement gate structure 15 can include an etch chemistry for removing the first replacement gate structure 15 is selective to the material layers of the stack 10 of the first and second semiconductor material layers 5a, 5b.

Referring to FIG. 5, the method may continue with removing one of the semiconductor material layers in the stacks for forming the nanosheets 10 for the first stack 11a of nanosheets 10 for the first conductivity type nanosheet device and the second stack 11b of nanosheets 10 for the second conductivity type nanosheet device at step 5. In some embodiments, at least one of the material layers of the stacks is removed selectively to at least a remaining material composition that provides suspended channel structures, i.e., nanosheets 10. For example, in one embodiment when the first semiconductor material layer of the stacks is composed of silicon germanium (SiGe) and the second semiconductor material layer of the stacks is composed of silicon, the first semiconductor material layer may be removed selectively to the second semiconductor material layer with an etch process, such as a wet chemical etch. Removing the replacement gate structure produces a gate opening that exposes a channel portion of the stacks of the two semiconductor materials that are processed to provide the first stack 11a of the nanosheets 10 for the first conductivity type nanosheet devices and the second stack 11b of the nanosheets 10 for the second conductivity type nanosheets devices.

Following removal of one of the material layers of the stack, e.g., removal of the first semiconductor material layer of the stack, a suspended channel structure is provided, as depicted in FIG. 6. By "suspended channel" it is meant that at least one semiconductor material layer, i.e., nanosheets 10, is present overlying the substrate 5, wherein the sidewalls of the suspended channel are supported, e.g., anchored, in the spacer. Gate structure materials, electrically conductive materials and/or semiconductor materials may be formed in the space surrounding the suspended structures. The suspended channels are provided by nanosheets 10. The term "nanosheet" denotes a substantially two dimensional structure with thickness in a scale ranging from 1 to 100 nm. The width and length dimensions of the nanosheet may be greater than the width dimensions. Although FIG. 6 depicts three suspended channel structures for each of the first stack 11a of nanosheets 10 and the second stack 11b of nanosheets 10, the present disclosure is not limited to only this embodiment. Any number of suspended channel structures, as suspended nanosheets 10, may be formed using the methods and structures provided by the present disclosure.

Figure 7:
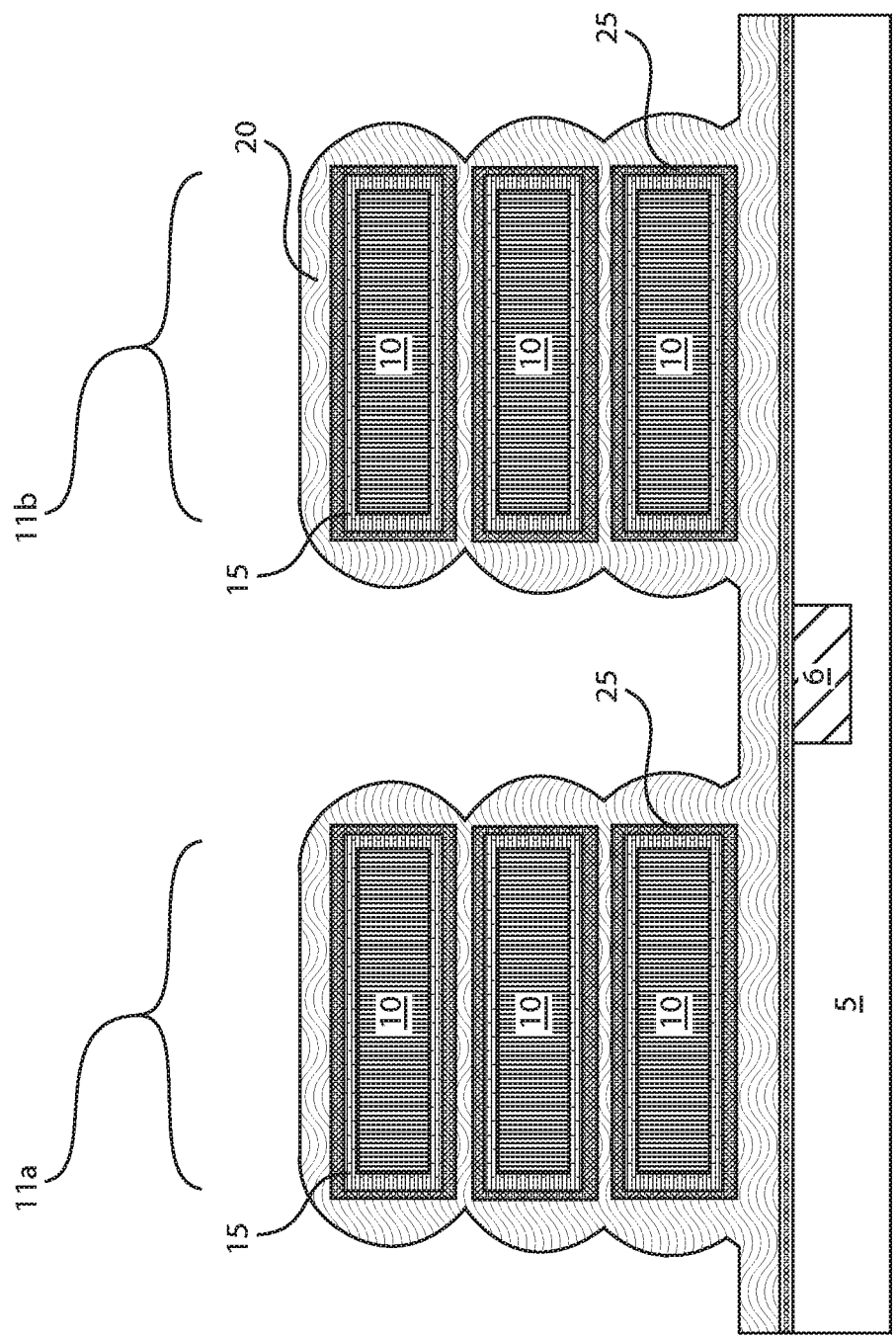
FIG. 7 is a side cross-sectional view depicting forming a gate dielectric on each nanosheet of the two stacks of nanosheets, and forming the dual layer stack including an etch stop layer and a first gate metal layer on the gate dielectric.

Referring to FIG. 5, the method may continue with depositing a gate dielectric 15 on the channel regions of the nanosheets 10 in the first and second stacks 11a, 11b of nanosheets 10 for the first and second conductivity type nanosheet devices at step 6, as depicted in FIG. 7. The gate dielectric 15 is a portion of the functional gate structure. The functional gate structure operates to switch the semiconductor device from an "on" to "off" state, and vice versa. The functional gate structure may be formed by first depositing at least one gate dielectric on the nanosheets 10 of the semiconductor device followed by filling the void with at least one gate conductor that is deposited on the at least one gate dielectric 15. The gate dielectric 15 can be formed on the entirety of the exterior surface of the nanosheets 10.

The at least one gate dielectric 15 may comprise a semiconductor oxide, semiconductor nitride, semiconductor oxynitride, or a high k material having a dielectric constant greater than silicon oxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

The gate dielectric 15 may be deposited on the channel region portions of the first and second stacks 11a, 11b of nanosheets 10 using atomic layer deposition (ALD). Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a deposition surface by exposing the surface to alternate gaseous species (typically referred to as precursors). In contrast to chemical vapor deposition, the precursors are never present simultaneously in the reactor, but they are inserted as a series of sequential, non-overlapping pulses. In each of these pulses, the precursor molecules react with the surface in a self-limiting way, so that the reaction terminates once all the reactive sites on the surface are consumed. In some embodiments, the monolayer deposition provided by the atomic layer depositions mechanisms provides that the layer be conformal.

The at least one gate dielectric 15 can also be formed by chemical vapor deposition (CVD), such as plasma enhanced chemical vapor deposition (PECVD), metal organic chemical vapor deposition (MOCVD), or atomic layer deposition (ALD). In another embodiment, the at least one gate dielectric can be formed using thermal growth methods, such as oxidation.

In some embodiments, the at least one gate dielectric 15 may have a thickness ranging from about 1.0 nm to about 6.0 nm.

Referring to FIG. 5, in a following process step a dual layer scheme of metal containing layers may be deposited on the gate dielectric 15 that is present on the channel region portion of the first stack and second stack 11a, 11b of nanostructures at step 7. In some embodiments, the dual layer scheme of metal containing layers includes an etch step layer 25 and a metal gate layer 20, as depicted in FIG. 7. Because the process sequence that is described with reference to FIGS. 5-11 is a process that forms two nanosheet devices on a single substrate, i.e., two gate structure (one for each device), the metal gate layer 20 will hereafter be referred to as a first metal gate layer 20.

In one embodiment, the dual layer scheme may be configured for the channel region of a p-type nanosheet device, i.e., the device formed from the first stack 11a of nanosheets 10, in which a first layer, i.e., etch stop layer 25, is composed of a first nitride, and is present directly on gate dielectric 15 that is present on the channel region of the nanosheets 10, and a second layer, i.e. first gate metal layer 20, that is present on the first layer. In some embodiments, when the first gate metal layer 20 is composed of titanium nitride (TiN) or TiAl, or TiAlC, the etch stop layer 25 is composed of tantalum nitride (TaN). Because the dual layer scheme is configured to provide a p-type nanosheet device, the portion of the gate metal layer 20 is processed to remain on the nanosheets 10 in the first stack 11a, but the gate metal layer 20 is removed from the nanosheets 10 in the second stack 11b.

As depicted in FIG. 7, the etch stop layer 25 and the first gate metal layer 20 can be blanket deposited on the channel region of both the nanosheets 10 in the first stack 11a that provides the p-type nanosheet semiconductor devices and the second stack 11b that provides the n-type nanosheet semiconductor devices. As will be described in greater detail below, the etch stop layer 25 protects the nanosheets 10, i.e., particularly the gate dielectric 15 on the edges E1 and upper surfaces of the nanosheets 10, while the first gate metal layer 20 is being removed from the second stack 11b of nanosheets 10 that are processed to provide n-type nanosheet semiconductor devices.

The etch stop layer 25 is formed directly on the gate dielectric layer 15. The etch stop layer 25 that is depicted in FIG. 7 is similar to the etch stop layer 25 described above with reference to FIGS. 3 and 4. Therefore, the description of the etch stop layer 25 that is provided above for FIGS. 3 and 4 provides the description for some embodiments of the etch stop layer described in FIG. 7, as well as the method described with reference to FIGS. 5-11.

In some embodiments, the etch stop layer 25 may be composed of a metal nitride. For example, the etch stop layer 25 may have a composition that provides that the later deposited first gate metal layer 20 can be removed by a wet etch that does not remove the etch stop layer 25. This protects the underlying gate dielectric layer 15. Thereafter, in some embodiments, the etch stop layer 25 may be removed by a wet etch that does not remove the material of the underlying nanosheet 10.

In one example, when the subsequently formed first gate metal layer 20 is composed of titanium nitride (TiN), the etch stop layer 25 is composed of tantalum nitride (TaN). It is noted that tantalum nitride (TaN) is only one example of a composition of an etch stop layer 25. For example, the etch stop layer 25 can be composed of other metal nitrides, such as tungsten nitride (WN), or aluminum oxide (AlOx), or lanthanum oxide (LaOx).

In some embodiments, the etch stop layer 25 may be blanket deposited using atomic layer deposition (ALD). In other examples, the etch stop layer 25 may be deposited using physical vapor deposition (PVD), chemical vapor deposition (CVD), plating or combinations thereof. In some embodiments, the at least one etch stop layer 25 may have a thickness ranging from about 1.0 nm to about 6.0 nm.

The first gate metal layer 20 is formed directly on the etch stop layer 25. The first gate metal layer 20 that is depicted in FIG. 7 is similar to the gate metal layer 20 described above with reference to FIGS. 3 and 4. Therefore, the description of the gate metal layer 20 that is provided above for FIGS. 3 and 4 provides the description for some embodiments of the gate metal layer 20 described in FIG. 7, as well as the method described with reference to FIGS. 5-11.

In some embodiments, the first gate metal layer 20 may be a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). Therefore, in some embodiments the gate metal layer 20 may be titanium nitride (TiN), and may provide a p-type work function layer.

In one embodiment, a first gate metal layer 20 that is composed of titanium nitride (TiN) may be deposited using atomic layer deposition (ALD). In one embodiment, the first gate metal layer 20 is composed of titanium nitride (TiN) that may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the first gate metal layer 20 may also be formed using chemical vapor deposition (CVD). In some embodiments, the first gate metal layer 20 may have a thickness ranging from about 1.0 nm to about 6.0 nm.

Although titanium nitride (TiN) has been described for the first gate metal layer 20, the present disclosure is not limited to only this example. In some embodiments, the first gate metal layer 20 may be a p-type work function metal layer that is composed of TiAlN, Ru, Pt, Mo, Co and alloys and combinations thereof.

Referring to FIG. 5, at step 8, the method may continue with forming a block mask 26 over the first stack 11a of nanosheets 10 including the portion of the gate dielectric 15 on the nanosheets 10 in the first stack 11a, and the dual layer scheme of the etch stop layer 25 and the metal gate electrode 20 that is present on the first stack 11a of nanosheets 10. The block mask 26 that is present over the first stack 11a of nanosheets 10 leaves the second stack 11b of nanosheets exposed. Therefore, the block mask 26 that is present over the first stack 11a of nanosheets 10 leaves the dual layer scheme of the etch stop layer 25 and the metal gate electrode 20 that is present over the second stack 11b of nanosheets 10 exposed.

In some embodiments, the block mask 26 may comprise soft and/or hardmask materials and can be formed using deposition, photolithography and etching. In one embodiment, the block mask 26 may be composed of a photoresist material. In one embodiment, the block mask 26 is a hardmask composed of a nitride-containing material, such as silicon nitride. It is noted that it is not intended that the block mask 26 be limited to only silicon nitride, as the composition of the hardmask may include any dielectric material that may be deposited by chemical vapor deposition (CVD) and related methods. Other hardmask compositions for the block mask 26 may include silicon oxides, silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG).

Figure 8:
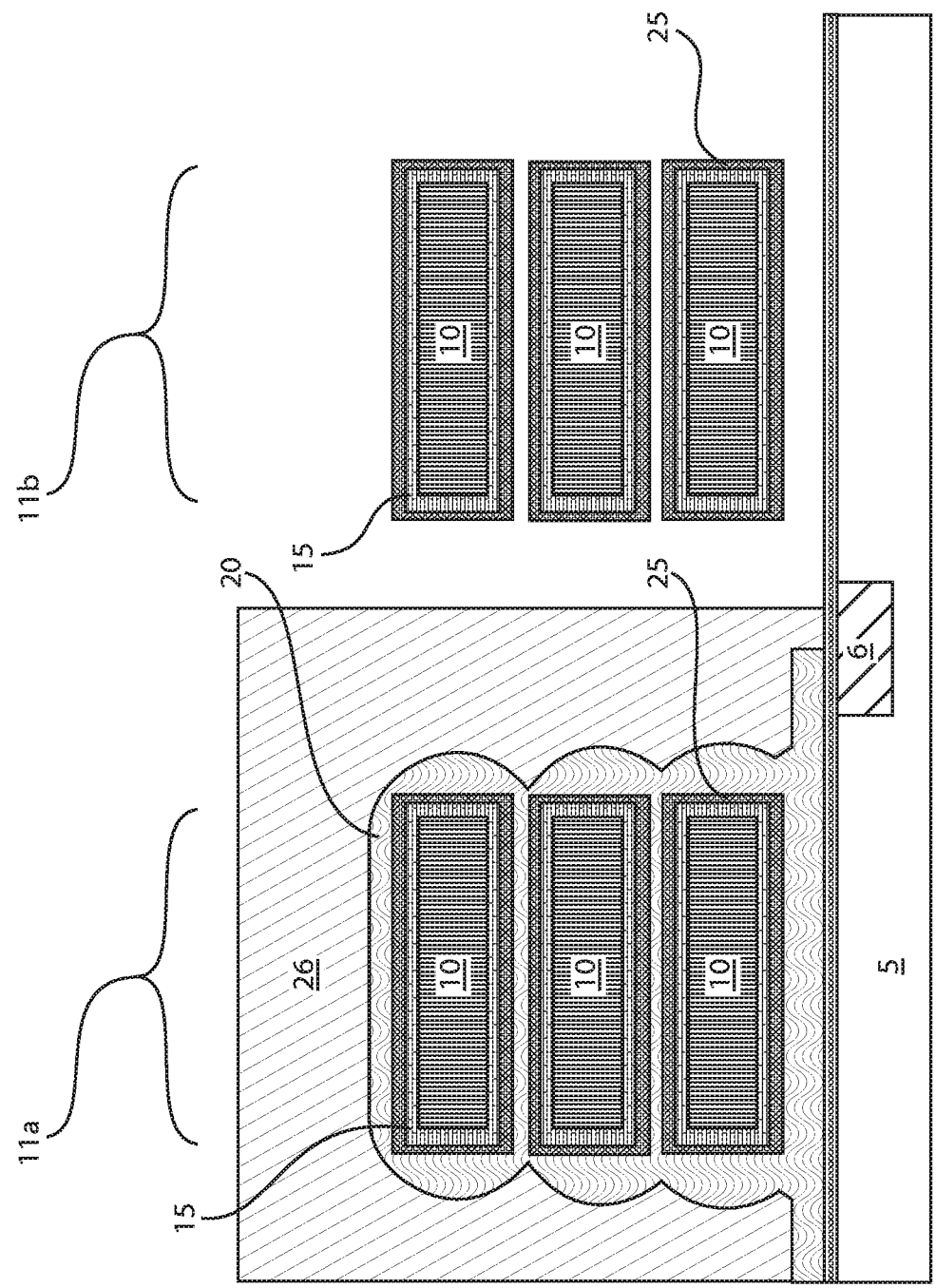
FIG. 8 is a side cross-sectional view of one embodiment of forming a block mask over the first stack of nanosheets, and removing the first gate metal layer from the second stack of nanosheets.

Still referring to FIG. 8, while the block mask 26 is present overlying the first stack 11a of nanosheets 10, the exposed portion of the gate metal layer 20 is removed from the nanosheets 10 of the second stack 11b using a wet chemical etch that is selective to the etch stop layer 25. The etch for removing the gate metal layer 20 is also selective to the block mask 26.

The etch stop layer 25 protects the underlying gate dielectric 15 and the nanosheets 10 from being over-etched, especially at the edges E1 and the upper surfaces of the nanosheets, where over-etching can occur in structures that do not include the etch stop layer 25. Due to the presence of the etch stop layer 25, the etch time may be extended as necessary to remove an entirety of the gate metal layer 20 that is present between the stacked nanosheets 10 in the second stack 11b. The region between the adjacently stacked nanosheets 10, i.e., the vertical space between vertically stacked nanosheets 10, may be referred to as a "tunnel" region. Due to the width and length of the nanosheets 10, and the degree of separation between vertically stacked nanosheets 10, the first gate metal layer 20 that is present within the tunnel region may need etch time periods that would result in over-etching in structures not including the etch stop layer 25 to remove the entirety of the first gate metal layer 20 from the tunnel region. In some embodiments, the etch stop layer 25 can enable the complete removal of the first gate metal layer 20 from the second stack 11b of nanosheets 10 including the tunnel region without any etch erosion and/or damage to the edges E1 of the nanosheets 10 and/or the upper surfaces of the nano sheets 10.

In one example, when the etch stop layer 25 is composed of tantalum nitride (TaN) and the metal gate layer 20 is composed of titanium nitride (TiN) or TiAl, or TiAlC, the etch chemistry may be composed of diluted $H_2O_2/NH_4OH$ solution at room temperature or hot (40-65° C.), or diluted $H_2O_2$ solution or Tetraethylammonium Hydroxide solution (TEAH) etc.

Figure 9:
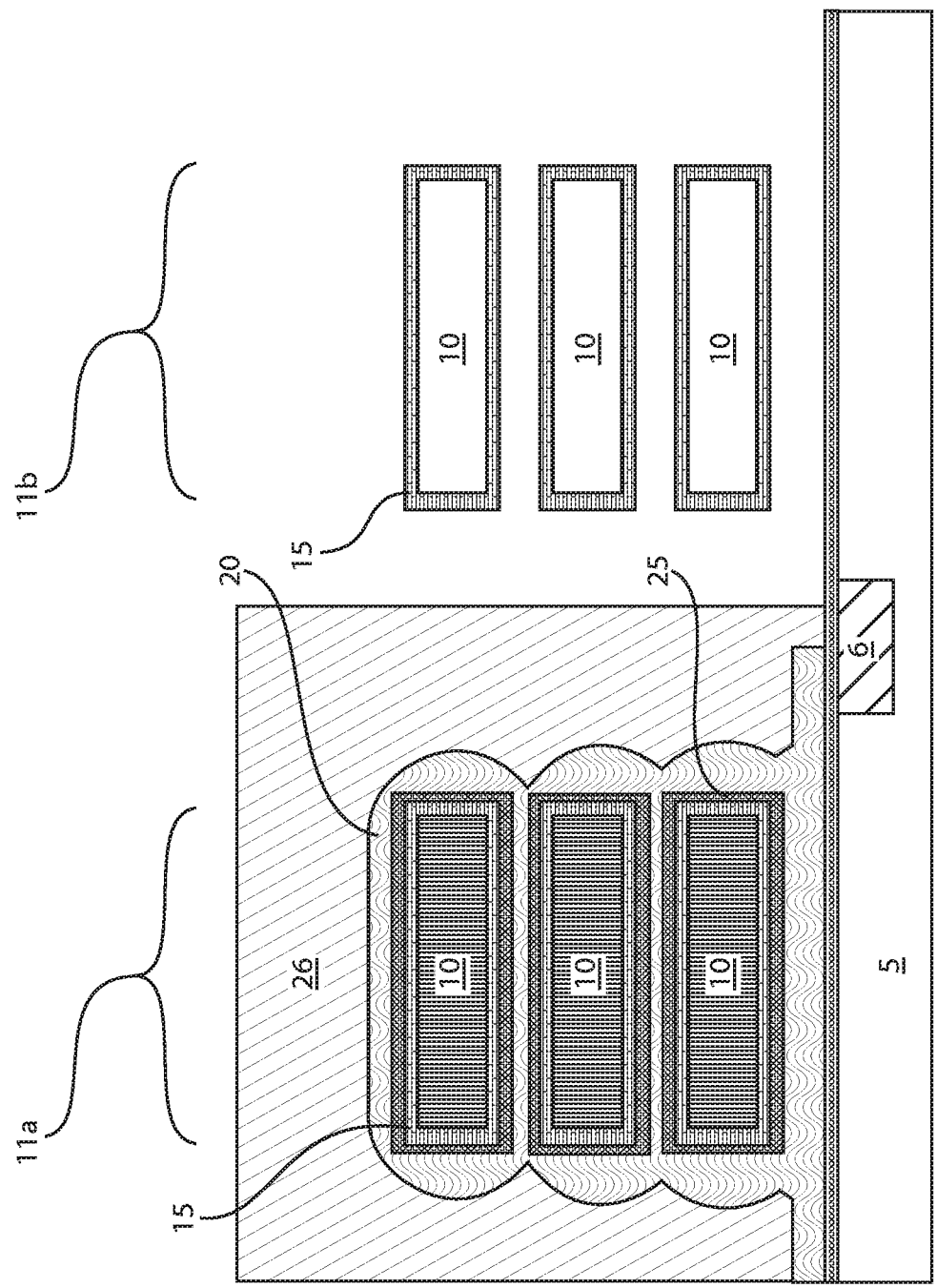
FIG. 9 is a side cross-sectional view of one embodiment of removing the etch stop layer from the second stack of nanosheets.

Referring to FIG. 5, in a following step 9, the method may continue with removing the exposed portion of the etch stop layer 25 from the second stack 11b of nanosheets 10, as depicted in FIG. 9. The etch stop layer 25 may be removed by a wet etch that is selective to the gate dielectric layer 15 that is present on the nanosheets 10 in the second stack 11b. The etch chemistry for removing the etch stop layer 25 may also be selective to the block mask 26. In one example, when the gate dielectric layer 15 is composed of hafnium oxide ($HfO_2$), and the etch stop layer is composed of tantalum nitride (TaN), the etching can be $HF/HNO_3/H_2O$ solution first then followed by the $NH_4OH/H_2O_2$ solution etching.

In another example, when the gate dielectric layer 15 is composed of hafnium oxide ($HfO_2$), and the etch stop layer is composed of aluminum oxide (AlOx) or lanthanum oxide (LaOx), the etching can be diluted $HCL+H_2O_2$ solution first then followed by the $NH_4OH+H_2O_2$ solution etching.

In some embodiments, because the first gate metal 20 has been removed from the second stack 11b of nanostructures including being entirely removed from the space, i.e., tunnel region, that is separating vertically stacked nanosheets 10, the wet etch can access the portion of the etch stop layer 25 that is present between the adjacently stacked nanosheets in the second stack 11b. This can increase the etch efficiency for removing the etch stop layer 25, as well as reduced over etching of the etch stop layer 25 into the gate dielectric 15. By reducing over etching of the gate dielectric 15, the methods and structures provided herein reduce leakage, e.g., high-k leakage when the gate dielectric 15 is composed of a high-k gate dielectric.

Figure 10:
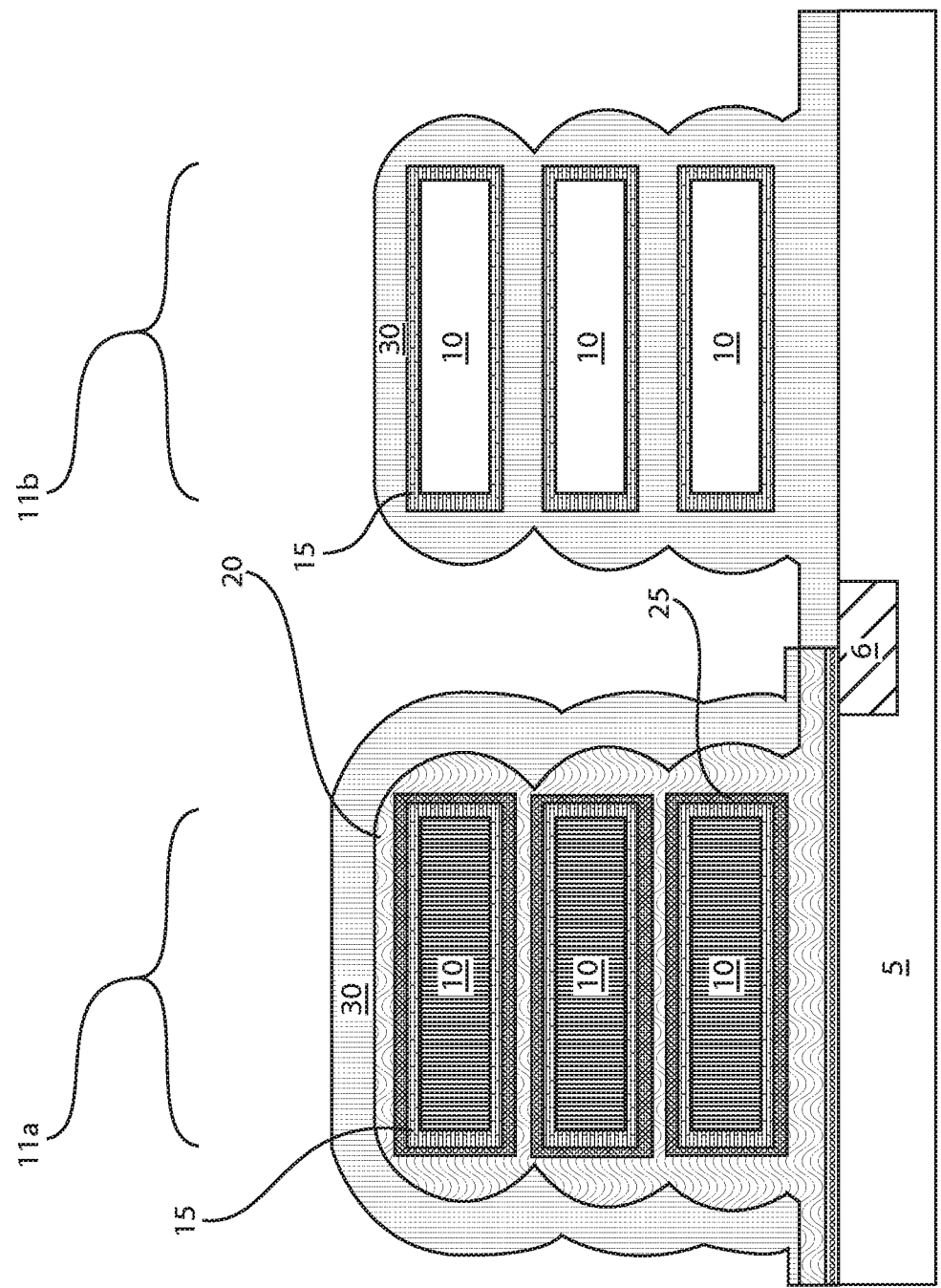
FIG. 10 is a side cross-sectional view of one embodiment of forming a second gate metal layer over the first and second stacks of nanosheets depicted in FIG. 9.
Figure 11:
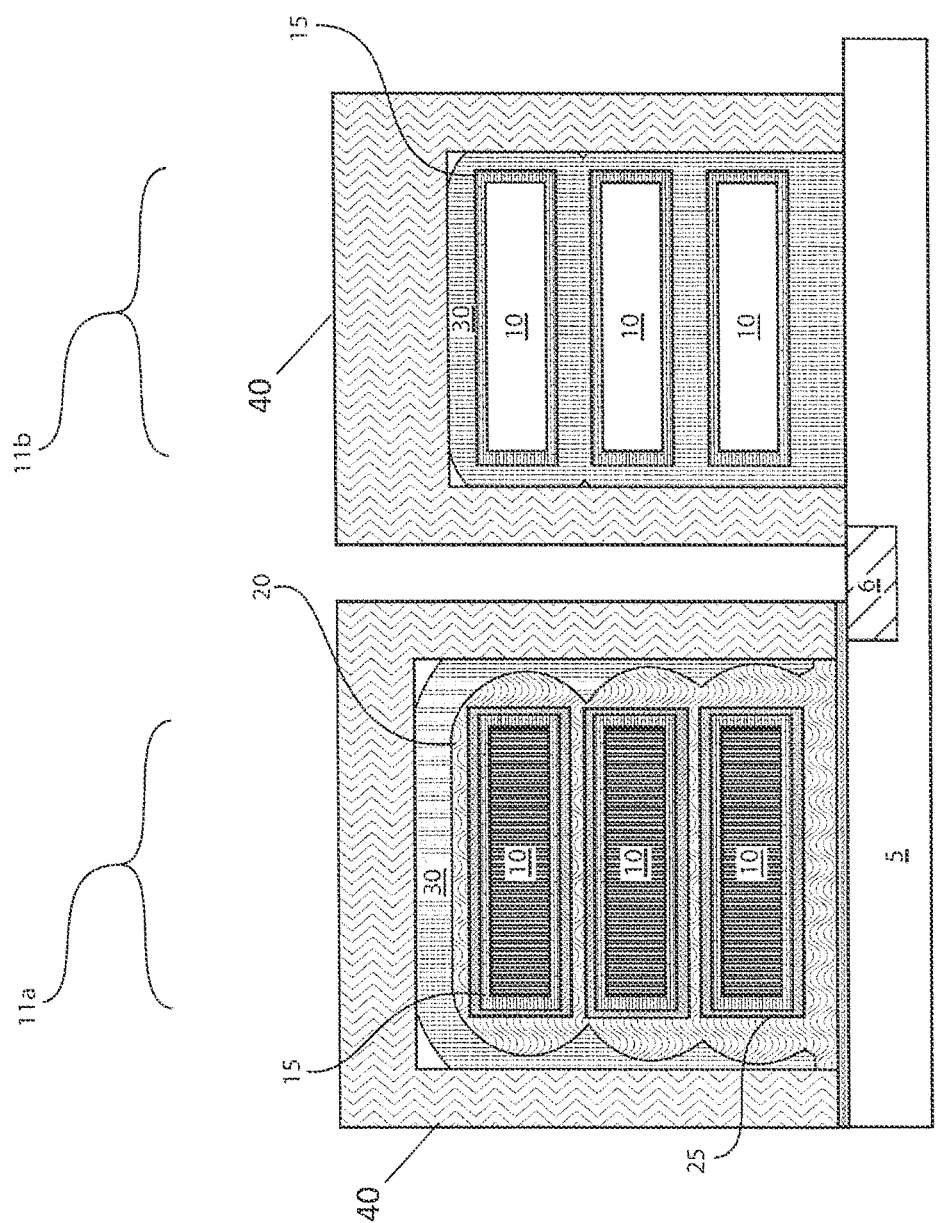
FIG. 11 is a side cross-sectional view depicting forming a gate electrode material layer over the structure depicted in FIG. 9 followed by pattern and etch processes to define gate structures.

Referring to FIG. 5, in a following step 10, the method may continue with removing the block mask 26, and depositing a second gate metal layer 30 on at least the exposed gate dielectric 15 that is present on the channel region of the nanosheets 10 in the second stack 11b, as depicted in FIG. 10. In the embodiment that is depicted in FIG. 10, the second gate metal layer 30 may be blanket deposited atop the entire structure including the first stack 11a of nanosheets 10, and the second stack 11b of nanosheets 10. The present disclosure is not limited to only this example, in some embodiments, prior to forming the second gate metal layer 30, a second block mask (not depicted) may be formed over the first stack 11a of nanosheets 10, or the first block mask 26 (depicted in FIG. 9) remains, wherein either one of these block masks protects the nanosheets in the first stack 11a from having the second gate metal layer 30 deposited thereon.

The second gate metal layer 30 is deposited directly on the gate dielectric 15 that is present on the channel portion of the nanosheets 10 in the second stack 11b. In the embodiment depicted in FIG. 10, the second stack 11b of nanosheets 10 is being processed to provide an n-type conductivity nanosheet device. In some embodiments, the second gate metal layer 30 may be an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof.

In some embodiments, the second gate metal layer 30, e.g., n-type work function metal layer, may be deposited using atomic layer deposition (ALD). The second gate metal layer 30, e.g., n-type work function metal layer, can be deposited using chemical vapor deposition (CVD), physical vapor deposition (PVD), plating or a combination thereof.

In some embodiments, the second gate metal layer 30 may have a thickness ranging from about 1.0 nm to about 6.0 nm.

In some embodiments, the method may include the step of removing the second gate metal layer 30 from the channel region of the nanosheets 10 in the first stack 11a. This can be accomplished by forming a block mask over the second stack 11b of nanosheets 10, followed by removing the second gate metal layer 30 from being present over the first stack 11a of nanosheets 10 using a selective etch process. This step is optional, and is not depicted in the process flow illustrated by FIGS. 5-11.

Referring to FIG. 5, in a following step 11, the method may continue with depositing a gate electrode material layer 40, and patterning the stack of the gate electrode material 40, the second gate metal layer 30, and the first gate metal layer 20. The stack of the gate electrode material 40, the second gate metal layer 30, and the first gate metal layer 20 may be patterned to provide a first gate structure to the p-type nanosheet device employing the nanosheets 10 of the first stack 11a, and a second gate structure to the n-type nanosheet device employing the nanosheets 10 of the second stack 11b. The at least one gate electrode material 40 may comprise a doped semiconductor, such as n-type polysilicon, or an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The at least one gate electrode material layer 40 can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes.

Following deposition of the gate electrode material layer 40, photolithography and etch processes are used to pattern the structure to provide a first gate structure composed of a first portion of the gate electrode material layer 40, the second gate metal layer 30, the first gate metal layer 20, the etch stop layer 25, and the gate dielectric 15 to the p-type nanosheet device employing the nanosheets 10 of the first stack 11a; and to provide a second gate structure composed of a second portion of the gate electrode material layer 40 to the n-type nanosheet device employing the nanosheets 10 of the second stack 11b, the second metal gate layer 30 and the gate dielectric 15.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a device comprising:
   forming at least two stacks of nanosheets, wherein each nanosheet in each of said at least two stacks of nanosheets includes a gate dielectric; and
   forming a metal layer scheme on each nanosheet, the metal layer scheme comprising at least an etch stop layer of a first composition and a work function adjusting layer of a second composition, wherein the etch stop layer has a composition that provides that the work function adjusting layer is removable by a wet etch chemistry having a selectivity that does not remove the etch stop layer, wherein the etch stop layer is removed from one of the at least two stacks of nanosheets.

2. The method of claim 1, wherein the etch stop layer comprises a first metal nitride.

3. The method of claim 2, wherein the work function adjusting layer comprises a second metal nitride.

4. The method of claim 2, wherein the first metal nitride is comprised of tantalum nitride.

5. The method of claim 3, wherein the work function adjusting layer is a p-type work function adjusting layer.

6. The method of claim 5, wherein the p-type work function adjusting layer comprises titanium nitride.

7. A method for producing nanosheet semiconductor devices comprising:
   forming a first stack of suspended nanosheets on a first region of a substrate and a second stack of suspended nanosheets on a second region of the substrate, the second stack of suspended nanosheets including a gate dielectric;
   forming a metal layer scheme positioned on each nanosheet, the metal layer scheme comprising an etch stop layer of a first composition and a work function adjusting layer of a second composition, wherein the etch stop layer has a composition that provides that the work function adjusting layer is removable by a wet etch chemistry that is selective to the etch stop layer; and
   removing the work function adjusting layer from the second stack of suspended nanosheets in the second region of the substrate, while the work function adjusting layer remains on the first stack of suspended nanosheets, the work function adjusting layer is removed from the second stack of suspended nanosheets by a wet chemical etch that is selective to the etch stop layer, wherein the etch stop layer is removed from the second stack of suspended nanosheets without removing the gate dielectric.

8. The method of claim 7, wherein the etch stop layer comprises tantalum nitride.

9. The method of claim 7, wherein the work function adjusting layer comprises titanium nitride.

10. The method of claim 9, wherein the work function adjusting layer is a p-type work function adjusting layer.

11. The method of claim 10, further comprising forming an n-type work function adjusting layer on the second stack of suspended nanosheets.

12. The method of claim 11, further comprising forming a gate conductor layer over each of the first and second stacks of suspended nanosheets.

13. The method of claim 12, further comprising patterning the gate conductive layer, and the n-type work function adjusting layer to provide a first gate structure to the first stack of suspended nanosheets.

14. The method of claim 12, further comprising patterning the gate conductive layer, and the p-type work function adjusting layer to provide a second gate structure to the second stack of suspended nanosheets.

15. An electrical device comprising:
a first stack of suspended nanosheets in a first region of a substrate containing first conductivity type nanosheet devices, and a second stack of suspended nanosheets in a second region of the substrate including second conductivity type nanosheet devices;
an etch stop layer is present on a gate dielectric of said first stack of suspended nanosheets, the etch stop layer having a composition selected from the group consisting of tantalum nitride, aluminum oxide, lanthanum oxide and combinations thereof, wherein the etch stop layer is not present in the second stack of suspended nanosheets in the second region of the substrate;
a work function adjusting metal containing layer is present on the etch stop layer; and
a first gate conductor positioned on a first channel region of the suspended nanosheets in the first stack of suspended nanosheets in the first region and a second gate conductor positioned on a second channel region of the suspended nanosheets in the second region.

16. The electrical device of claim 15, wherein the work function adjusting metal containing layer is comprised of titanium nitride.

17. The electrical device of claim 16, wherein the work function adjusting metal containing layer is a p-type work function adjusting layer.

18. The electrical device of claim 17, wherein the etch stop layer comprises tantalum nitride.

* * * * *